United States Patent
Kawasaki et al.

(10) Patent No.: US 8,309,414 B2
(45) Date of Patent: Nov. 13, 2012

(54) SEMICONDUCTOR DEVICE AND METHOD OF MANUFACTURING SEMICONDUCTOR DEVICE

(75) Inventors: Toru Kawasaki, Kanagawa (JP); Satoshi Kura, Kanagawa (JP); Mitsuo Nissa, Kanagawa (JP); Naotaka Kamishita, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 166 days.

(21) Appl. No.: 12/805,291

(22) Filed: Jul. 22, 2010

(65) Prior Publication Data

US 2011/0042749 A1    Feb. 24, 2011

(30) Foreign Application Priority Data

Aug. 19, 2009 (JP) ................................. 2009-190066
Jun. 8, 2010 (JP) ................................. 2010-131424

(51) Int. Cl.
*H01L 27/088* (2006.01)
*H01L 21/8239* (2006.01)

(52) U.S. Cl. ......... 438/241; 257/E27.097; 257/E21.626; 438/275

(58) Field of Classification Search .......... 438/241, 438/275, FOR. 220; 257/E27.097, E21.626
See application file for complete search history.

(56) References Cited

U.S. PATENT DOCUMENTS

| | | | | |
|---|---|---|---|---|
| 5,329,482 A * | 7/1994 | Nakajima et al. | ............. | 365/182 |
| 5,942,450 A * | 8/1999 | Song | ............... | 438/747 |
| 6,338,993 B1 * | 1/2002 | Lien | ............... | 438/238 |
| 7,754,572 B2 | 7/2010 | Maekawa | | |
| 7,888,198 B1 * | 2/2011 | Yang et al. | .................... | 438/231 |
| 2003/0124776 A1 * | 7/2003 | Chung et al. | ................... | 438/128 |
| 2005/0051866 A1 * | 3/2005 | Wang et al. | .................... | 257/510 |
| 2006/0113686 A1 * | 6/2006 | Minami | ........................ | 257/900 |
| 2006/0151840 A1 * | 7/2006 | Maekawa | ........................ | 257/384 |
| 2006/0281241 A1 * | 12/2006 | Mathew | ......................... | 438/199 |
| 2007/0032011 A1 * | 2/2007 | Parekh et al. | ................. | 438/238 |
| 2007/0077709 A1 * | 4/2007 | Kim | ............................... | 438/257 |
| 2008/0073676 A1 | 3/2008 | Takeoka | | |
| 2010/0038692 A1 * | 2/2010 | Chuang et al. | ................ | 257/298 |

FOREIGN PATENT DOCUMENTS

| | | |
|---|---|---|
| JP | 2000-269351 A | 9/2000 |
| JP | 2004-349372 A | 12/2004 |
| JP | 2006-196493 A | 7/2006 |
| JP | 2008-78359 A | 4/2008 |

* cited by examiner

*Primary Examiner* — George Fourson, III
(74) *Attorney, Agent, or Firm* — McGinn IP Law Group, PLLC

(57) ABSTRACT

A first transistor includes a first gate insulating film, a first gate electrode, and a first sidewall. A second transistor includes a second gate insulating film, a second gate electrode, and a second sidewall. A capacitive element is connected to one side of source and drain regions of the second transistor. The first gate insulating film has the same thickness as that of the second gate insulating film, and the first gate electrode has the same thickness of that of the second gate electrode. The width of the second sidewall is larger than the width of the first sidewall.

14 Claims, 15 Drawing Sheets

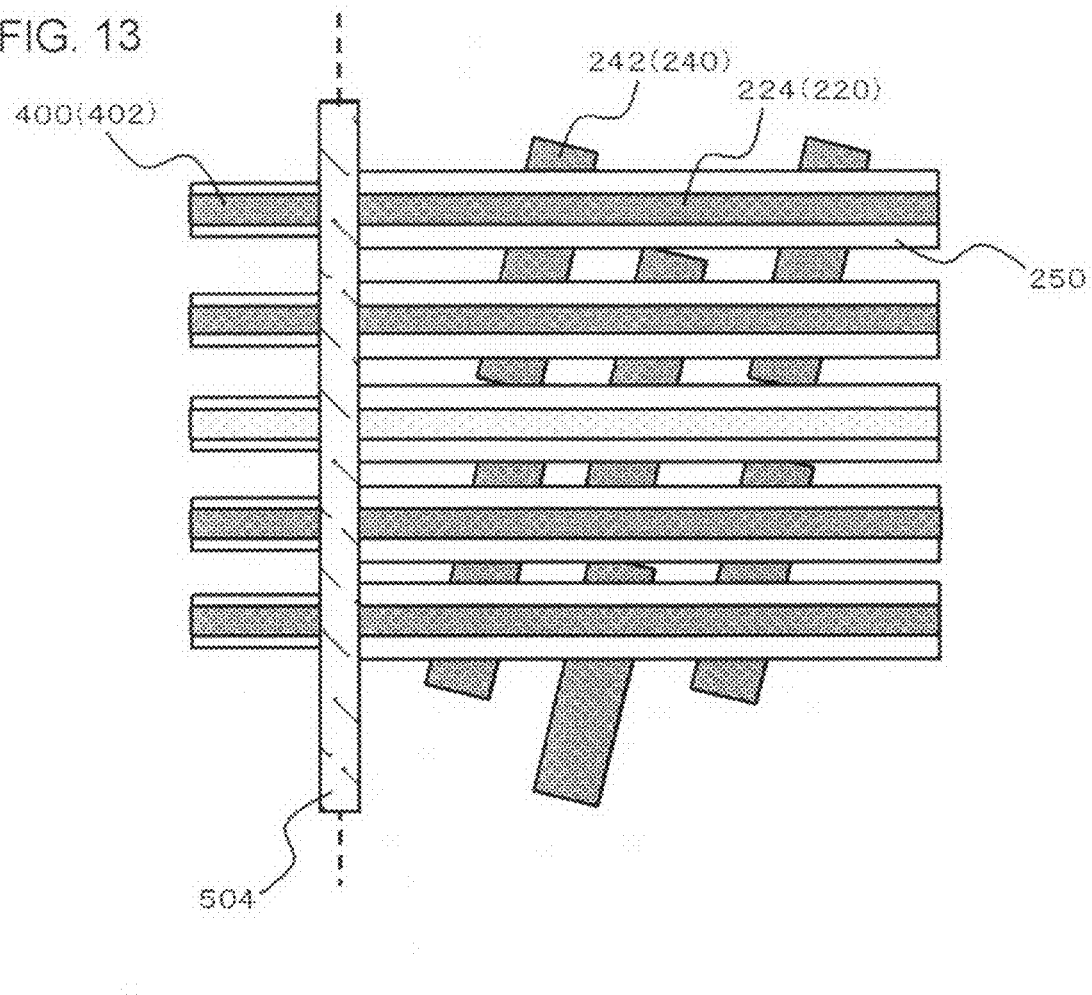

SEMICONDUCTOR DEVICE AND METHOD OF MANUFACTURING SEMICONDUCTOR DEVICE

The application is based on Japanese patent application NOS. 2009-190066 and 2010-131424, the content of which is incorporated hereinto by reference.

BACKGROUND

1. Technical Field

The present invention relates to a semiconductor device having a sidewall and a method of manufacturing the semiconductor device.

2. Related Art

In recent years, semiconductor devices have been manufactured in which a logic circuit and a memory device such as Dynamic Random Access Memory (DRAM) are integrated onto one substrate. In such semiconductor devices, a transistor included in the logic circuit and a transistor included in a peripheral circuit of the DRAM are generally manufactured by the same process. For this reason, the transistor included in the logic circuit and the transistor included in the peripheral circuit of the DRAM have, in general, mutually the same structure.

On the other hand, it is often the case that the latest transistors have a sidewall and an extension region of a source and drain region. The sidewall covers a sidewall of a gate electrode. The extension region is located under the sidewall, that is, between the source and drain region and the channel region (for example, Japanese Unexamined patent publication NOS. 2000-269351, 2004-349372, 2008-78359, and 2006-196493).

In particular, Japanese Unexamined patent publication NOS. 2004-349372 and 2008-78359 disclose that an N-type MOS transistor and a P-type MOS transistor are made different from each other in width of the sidewall.

In the transistor included in the logic circuit, it is preferable that the on-state current is high. On the other hand, in the transistor connected to a capacitive element, such as the transistor included in the peripheral circuit of the DRAM, it is preferable that the leak current is small. Recently, miniaturization of semiconductor devices has progressed, and the gate length has been shortened with this progress. When the gate length is shortened, the on-state current of the transistor is increased and thus a leak current is easily generated. As mentioned above, in the semiconductor device in which the logic circuit and the transistor connected to the capacitive element are integrated onto one substrate, the transistor included in the logic circuit and the transistor connected to the capacitive element are generally manufactured by the same process. For this reason, in the transistor connected to the capacitive element, the leak current is caused to increase.

SUMMARY

In one embodiment, there is provided a semiconductor device including: a first transistor, formed in a substrate, that includes a first gate insulating film, a source and drain region, a first gate electrode, and a first sidewall; and a second transistor, formed in the substrate, that includes a second gate insulating film, a second gate electrode, a source and drain region, and a second sidewall, wherein the first transistor is a portion of a logic circuit, the second transistor is a transistor included in a memory cell of a DRAM, or is a portion of a peripheral circuit that performs writing and erasing with respect to the DRAM, the first gate insulating film has the same thickness as that of the second gate insulating film, the first gate electrode has the same thickness as that of the second gate electrode, and the width of the second sidewall is larger than the width of the first sidewall.

According to such a semiconductor device, the width of the second sidewall is larger than the width of the first sidewall. For this reason, it is possible that while the on-state current of the first transistor is raised by decreasing the substantial gate length of the first transistor, the leak current of the second transistor is lowered by increasing the substantial gate length of the second transistor.

In another embodiment, there is provided a method of manufacturing a semiconductor device, including: forming, on a substrate, a first gate insulating film and a first gate electrode of a first transistor which are a portion of a logic circuit, and a second gate insulating film and a second gate electrode of a second transistor which is included in a memory cell of a DRAM or a portion of a peripheral circuit that performs writing and erasing with respect to the DRAM; and forming an extension region of the first transistor and an extension region of the second transistor, forming a first sidewall in a sidewall of the first gate electrode, forming a second sidewall having a larger width than that of the first sidewall in a sidewall of the second gate electrode, and forming a source and drain region in each of the first transistor and the second transistor.

According to the invention, it is possible that while the on-state current of the first transistor is raised, the leak current of the second transistor is lowered.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 13 is a plan view illustrating the configuration of the semiconductor device according to the comparative example.

DETAILED DESCRIPTION

Figure 1:
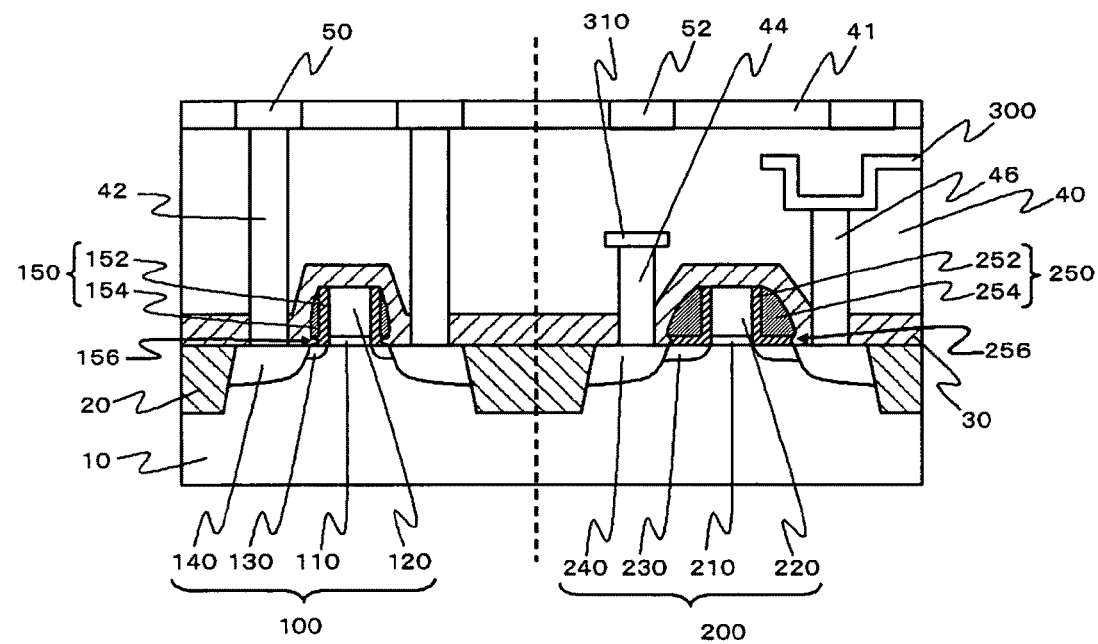
FIG. 1 is a cross-sectional view of a semiconductor device according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, the embodiment of the invention will be described with reference to the accompanying drawings. In all the drawings, like elements are referenced by like reference numerals and descriptions thereof will not be repeated.

First Embodiment

FIG. 1 is a cross-sectional view of a semiconductor device according to a first embodiment. This semiconductor device includes a first transistor 100, a second transistor 200, and a capacitive element 300. The first transistor 100 is formed in a substrate 10 such as a silicon substrate, and includes a first gate insulating film 110, a first gate electrode 120, and a first sidewall 150. The second transistor is formed the substrate 10, and includes a second gate insulating film 210, a second gate electrode 220, and a second sidewall 250. A capacitive element 300 is connected to the one side of source and drain regions 240 of the second transistor 200. The first gate insulating film 110 has the same thickness as that of the second gate insulating film 210, and the first gate electrode 120 has the same thickness as that of the second gate electrode 220. The width of the second sidewall 250 is wider than the width of the first sidewall 150. Hereinafter, a detailed description will be given.

The first transistor 100 has two source and drain regions 140. The source and drain regions 140 are respectively provided with an extension region 130. The extension region 130 is the same conductive impurity region as the source and drain regions 140, and has a lower impurity concentration than that of the source and drain regions 140. The extension region 130 is located under the first sidewall 150.

The second transistor 200 has two source and drain regions 240. The source and drain regions 240 are respectively provided with an extension region 230. The extension region 230 is the same conductive impurity region as the source and drain region 240, and has a lower impurity concentration than that of the source and drain region 240. The extension region 230 is located under the second sidewall 250. As mentioned above, the width of the second sidewall 250 is wider than the width of the first sidewall 150. For this reason, the width of the extension region 230 is wider than the width of the extension region 130 of the first transistor 100. Meanwhile, the width of the first sidewall 150 is equal to or greater than 1 nm and equal to or less than 70 nm, and the width of the second sidewall 250 is equal to or greater than 1.4 nm and equal to or less than 100 nm.

In the embodiment, the first gate insulating film 110 has the same not only thickness but also width as the second gate insulating film 210. The first gate electrode 120 has the same not only thickness but also width as the second gate electrode 220. The widths of the first gate electrode 120 and the second gate electrode 220 are equal to or less than, for example, 130 nm.

The capacitive element 300 is, for example, a MIM (Metal-Insulator-Metal) type capacitive element having a cylinder shape, and is a portion of a memory cell of Dynamic Random Access Memory (DRAM). The first transistor 100 is a portion of a logic circuit, and the second transistor 200 is a transistor included in the memory cell of DRAM, or is a portion of a peripheral circuit that performs writing and erasing with respect to DRAM. One side of the source and drain regions 240 of the second transistor 200 is connected to the capacitive element 300, and the other side of the source and drain regions 240 is connected to a bit line 310.

An etching stopper film 30 and an insulating interlayer 40 are in this order formed on the first transistor 100 and the second transistor 200. The etching stopper film 30 is, for example, TEOS, $SiO_2$, SiN, SiON, HDP, PSG, NSG, or BPSG, and functions as an etching stopper at the time of forming a contact hole in the insulating interlayer 40. The insulating interlayer 40 is a multilayer film in which a plurality of insulating films is laminated.

The first sidewall 150 is formed by a first insulating film 152 and a second insulating film 154, and the second sidewall 250 is formed by a first insulating film 252 and a second insulating film 254. The first insulating film 152 is located on the substrate 10 and on the sidewall of the first gate electrode 120, and is formed along the substrate 10 and the sidewall of the first gate electrode 120. The second insulating film 154 is formed on the first insulating film 152. Similarly, the first insulating film 252 is formed on the substrate 10 and on the sidewall of the second gate electrode 220, and the second insulating film 254 is formed on the first insulating film 252. The first insulating film 152 and the first insulating film 252 are the same film, and are formed of, for example, a silicon nitride film. The second insulating film 154 and the second insulating film 254 are the same film, and are formed of, for example, a silicon oxide film.

A concave portion 156 is provided in the end surface of the first insulating film 152 located on the substrate 10, and a concave portion 256 is provided in the end surface of the first insulating film 252 located on the substrate 10. The concave portion 156 is deeper than the concave portion 256. The etching stopper film 30 intrudes into both of the concave portions 156 and 256.

Meanwhile, contact plugs 42, 44, and 46 are buried in the insulating interlayer 40. In addition, an insulating film among interconnects 41 is formed on the insulating interlayer 40. Interconnects 50 and 52 are buried in the insulating film among interconnects 41. The contact plug 42 is connected to the interconnect 50 and one side of the source and drain regions 140 of the first transistor 100. The contact plug 44 is connected to the bit line 310 and one side of the source and drain regions 240 of the second transistor 200, and the contact plug 46 is connected to a lower electrode of the capacitive element 300 and the other side of the source and drain regions 240 of the second transistor 200.

Meanwhile, an device isolation insulating film 20 is formed in the substrate 10. The device isolation insulating film 20 is disposed to isolate each of the first transistor 100 and the second transistor 200 from others.

FIGS. 2A and 2B to FIGS. 4A and 4B are cross-sectional views illustrating a method of manufacturing the semiconductor device according to the embodiment. In the method of manufacturing the semiconductor device, first, the first gate insulating film 110 and the first gate electrode 120 of the first transistor 100, and the second gate insulating film 210 and the second gate electrode 220 of the second transistor 200 are formed on the substrate 10. Next, the extension region 130 of the first transistor 100 and the extension region 230 of the second transistor 200 are formed. Meanwhile, an impurity implantation process for forming the extension region 130 is performed using a process separate from the impurity implantation process for forming the extension region 230. Next, the first sidewall 150 is formed in the sidewall of the first gate electrode 120, and the second sidewall 250 having a larger width than that of the first sidewall 150 is formed in the sidewall of the second gate electrode 220. Next, the source and drain region 240 of the second transistor 200 is formed. Next, the capacitive element 300 which is connected to the source and drain region 240 is formed. Hereinafter, a detailed description will be given.

Figure 2A:
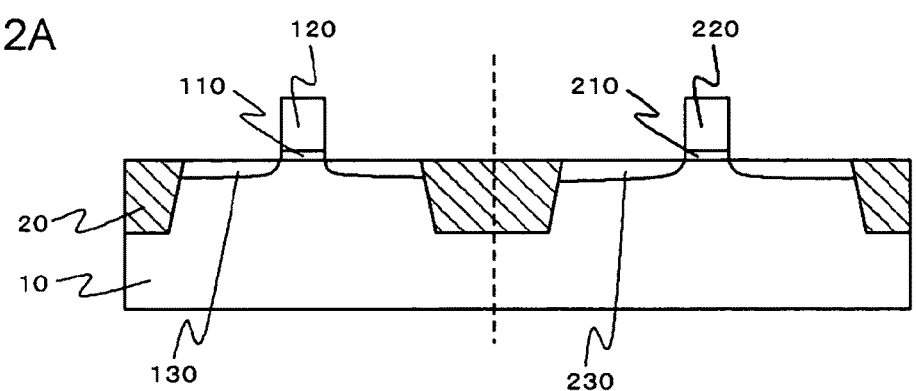
FIGS. 2A and 2B are cross-sectional views illustrating a method of manufacturing the semiconductor device shown in FIG. 1.

First, as shown in FIG. 2A, the device isolation insulating film 20 is formed in the substrate 10 by, for example, a Shallow Trench Isolation (STI) method. Next, the first gate insulating film 110 and the second gate insulating film 210 are formed in the substrate 10 by the same process. Subsequently, a conductive film, for example, a polysilicon film is formed on the whole surface including the upper portions of the first gate insulating film 110 and the second gate insulating film 210. The thickness of this conductive film is, for example, equal to or greater than 30 nm and equal to or less than 180 nm. Next, the conductive film is selectively removed. Thereby, the first gate electrode 120 and the second gate electrode 220 are formed. Meanwhile, the first gate electrode 120 and the second gate electrode 220 need not be polysilicon gates, and may be formed of, for example, silicides such as a nickel silicide, or metals.

Next, ion implantation is performed using the device isolation insulating film 20, the first gate electrode 120, and the second gate electrode 220 as a mask. Thereby, the extension region 130 of the first transistor 100 and the extension region 230 of the second transistor 200 are formed in a self-aligning manner.

Figure 2B:
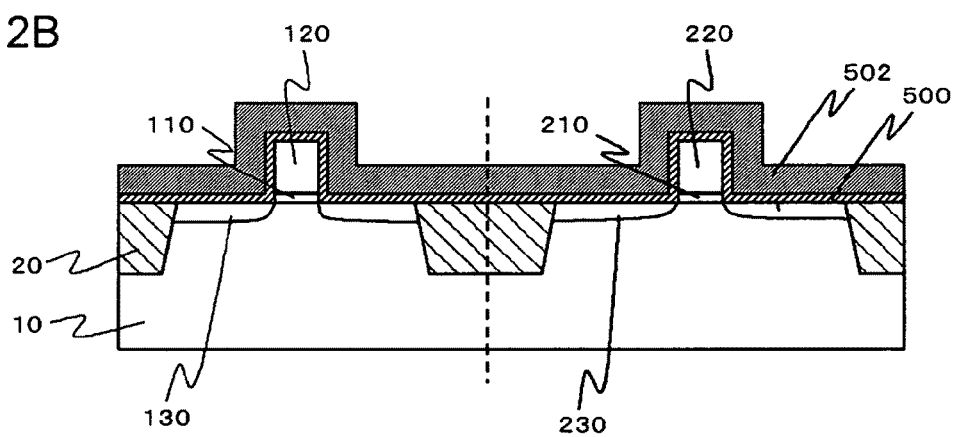

Next, as shown in FIG. 2B, a first insulating film 500 and a second insulating film 502 are in this order formed on the substrate 10, the device isolation insulating film 20, the first gate electrode 120, and the second gate electrode 220. The first insulating film 500 is, for example, a silicon nitride film, and the second insulating film 502 is a silicon oxide film. The thickness of the first insulating film 500 is, for example, equal to or greater than 3 nm and equal to or less 10 nm, and the thickness of the second insulating film 502 is, for example, equal to or greater than 10 nm and equal to or less than 100 nm.

Figure 3A:
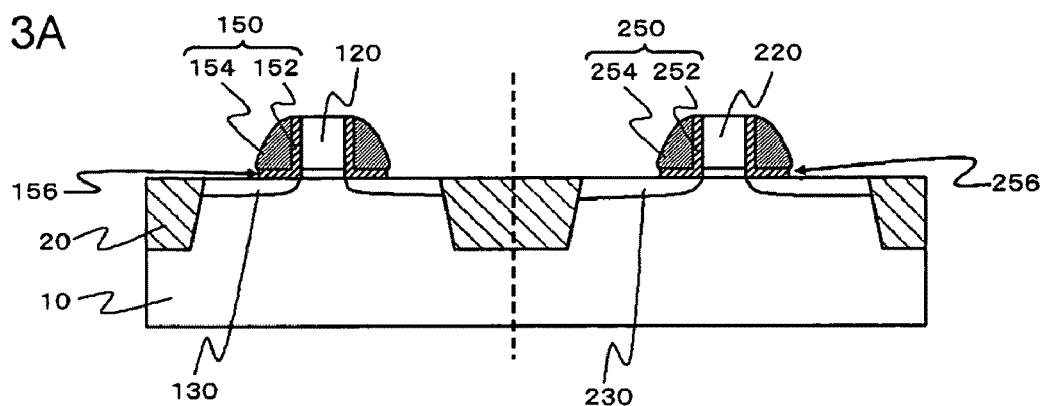
FIGS. 3A and 3B are cross-sectional views illustrating the method of manufacturing the semiconductor device shown in FIG. 1.

Next, as shown in FIG. 3A, the second insulating film 502 and the first insulating film 500 are etched. As this etching, for example, dry etching is initially performed, and then wet etching is performed. Thereby, the first sidewall 150 and the second sidewall 250 are formed. The concave portions 156 and 256 are respectively formed, due to wet etching, in the end surfaces of the portions located on the substrate 10 in the first insulating film 152 of the first sidewall 150 and the first insulating film 252 of the second sidewall 250. In the state shown in the same drawing, cross-sectional shapes of the first sidewall 150 and the second sidewall 250 are substantially equal to each other. In addition, the depths of the concave portions 156 and 256 are substantially equal to each other.

Figure 3B:
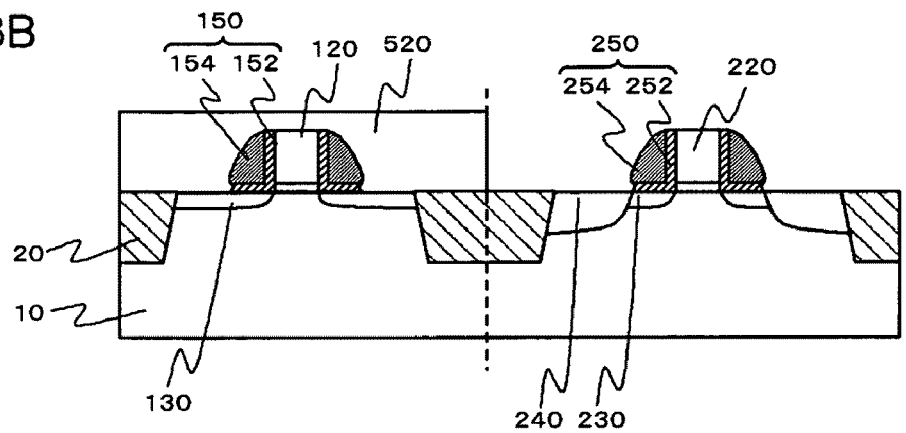

After that, as shown in FIG. 3B, a mask film 520 is formed on the substrate 10. The mask film 520 is, for example, a resist film, and covers the region in which the first transistor 100 is formed, but does not cover the region in which the second transistor 200 is formed. Next, ion implantation is performed using the mask film 520, the device isolation insulating film 20, the second gate electrode 220, and the second sidewall 250 as a mask. Thereby, the source and drain region 240 of the second transistor 200 is formed.

Figure 4A:
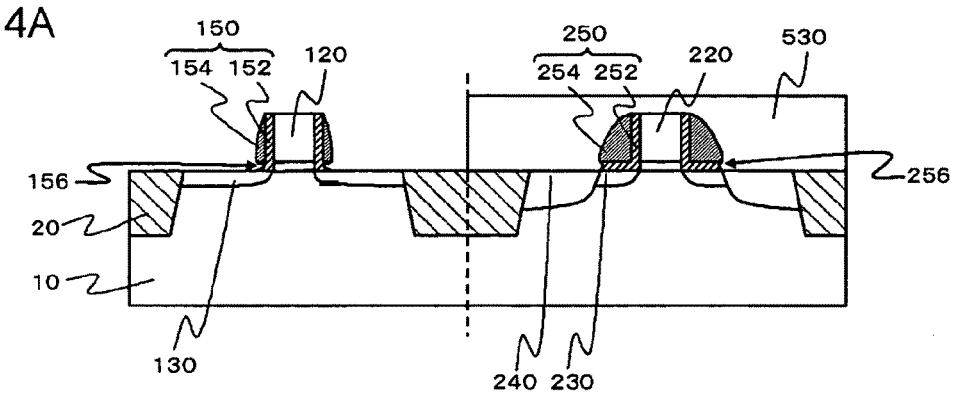
FIGS. 4A and 4B are cross-sectional views illustrating the method of manufacturing the semiconductor device shown in FIG. 1.

After that, as shown in FIG. 4A, the mask film 520 is removed. Next, a mask film 530 is formed on the substrate 10. The mask film 530 is, for example, a resist film, and covers the region (including the second gate electrode 220 and the second sidewall 250) in which the second transistor 200 is formed, but does not cover the region (including the first gate electrode 120 and the first sidewall 150) in which the first transistor 100 is formed.

Next, etching is performed using the mask film 530 as a mask. Thereby, the first sidewall 150 is etched, and decreases in width. This etching process includes a wet etching process. For this reason, the concave portion 156 is deepened.

Figure 4B:
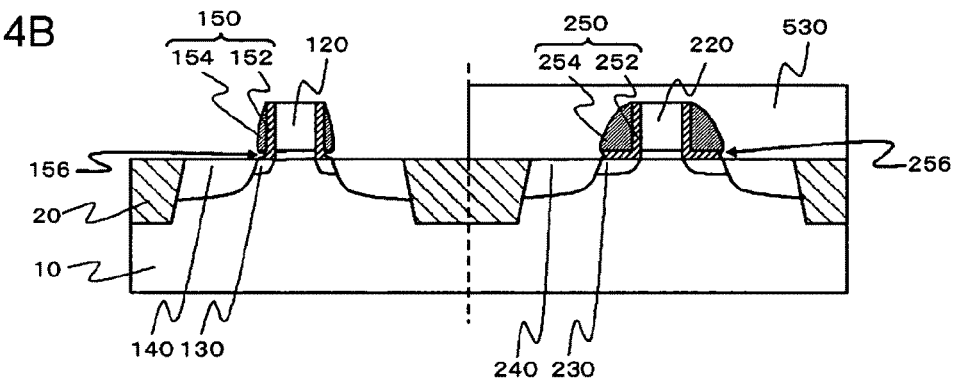

Next, as shown in FIG. 4B, ion implantation is performed using the mask film 530, the device isolation insulating film 20, the first gate electrode 120, and the first sidewall 150 as a mask. Thereby, the source and drain region 140 of the first transistor 100 is formed.

After that, the mask film 530 is removed. Thereafter, as shown in FIG. 1, the etching stopper film 30, the insulating interlayer 40, the capacitive element 300, the contact plugs 42, 44, and 46, the insulating film among interconnects 41, and the interconnects 50 and 52 are formed. In a process of forming the etching stopper film 30 among processes of forming them, a portion of the etching stopper film 30 intrudes into the concave portions 156 and 256.

Next, the action and advantages of the embodiment will be described. According to the embodiment, the width of the second sidewall 250 of the second transistor 200 is larger than the width of the first sidewall 150 of the first transistor 100. For this reason, the width of the extension region 230 of the second transistor 200 is larger than the width of the extension region 130 of the first transistor 100. Therefore, it is possible that while the on-state current of the first transistor 100 is raised by decreasing the substantial gate length of the first transistor 100, the leak current of the second transistor 200 is lowered by increasing the substantial gate length of the second transistor 200. For this reason, the holding time of information in the capacitive element 300 can be prolonged.

In addition, the etching stopper film 30 intrudes into the concave portion 156 of the first sidewall 150 and the concave portion 256 of the second sidewall 250, respectively. The concave portion 156 is deeper than the concave portion 256. For this reason, stress generated from the etching stopper film 30 is easily applied to a channel region of the first transistor 100. Therefore, the driving current of the first transistor 100 is increased.

Second Embodiment

FIGS. 5A and 5B to FIG. 7 are cross-sectional views illustrating a method of manufacturing the semiconductor device according to a second embodiment. The method of manufacturing the semiconductor device is the same as the method of manufacturing the semiconductor device shown in the first embodiment, with the exception of the formation timing of the first sidewall 150 and the second sidewall 250. In addition, the semiconductor device manufactured by the embodiment is the same as that of the first embodiment, with the exception that there is a case where the depth of the concave portion 156 is small.

Figure 5A:
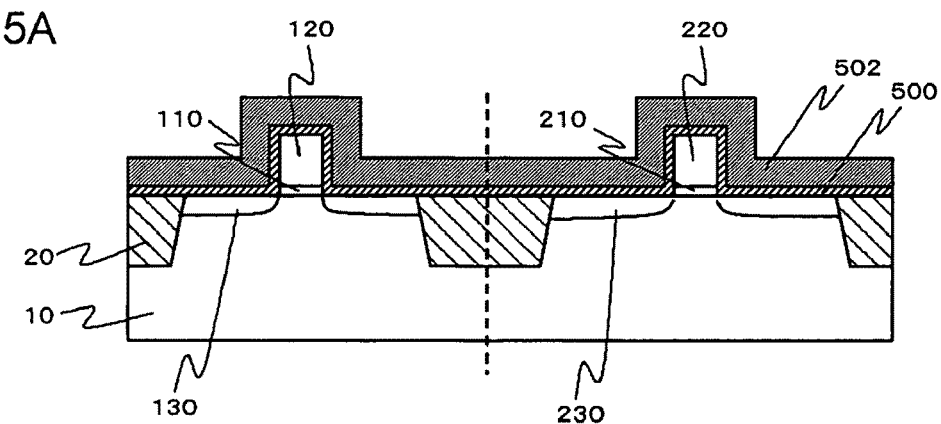
FIGS. 5A and 5B are cross-sectional views illustrating a method of manufacturing the semiconductor device according to a second embodiment.

First, as shown in FIG. 5A, the device isolation insulating film 20 is formed in the substrate 10, and the first gate insulating film 110 and second gate insulating film 210, the first gate electrode 120 and the second gate electrode 220, the extension regions 130 and 230, and the first insulating film 500 and the second insulating film 502 are further formed therein. The method of forming them is the same as that of the first embodiment.

Figure 5B:
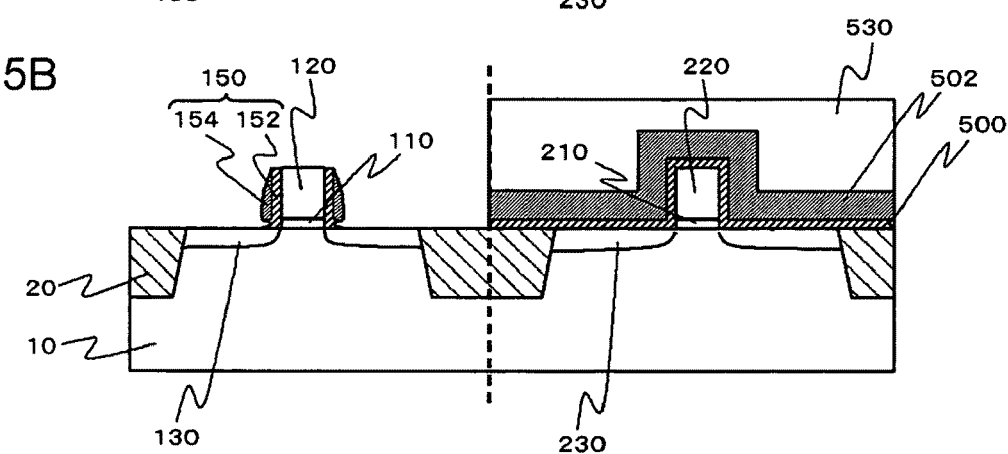

Next, as shown in FIG. 5B, the mask film 530 is formed in the substrate 10. The mask film 530 is, for example, a resist film, and covers the region (including the second gate electrode 220) in which the second transistor 200 is formed, but does not cover the region (including the first gate electrode 120) in which the first transistor 100 is formed.

Next, first insulating film 500 and second insulating film 502 are etched using the mask film 530 as a mask. Thereby, the first sidewall 150 is formed.

Figure 6A:
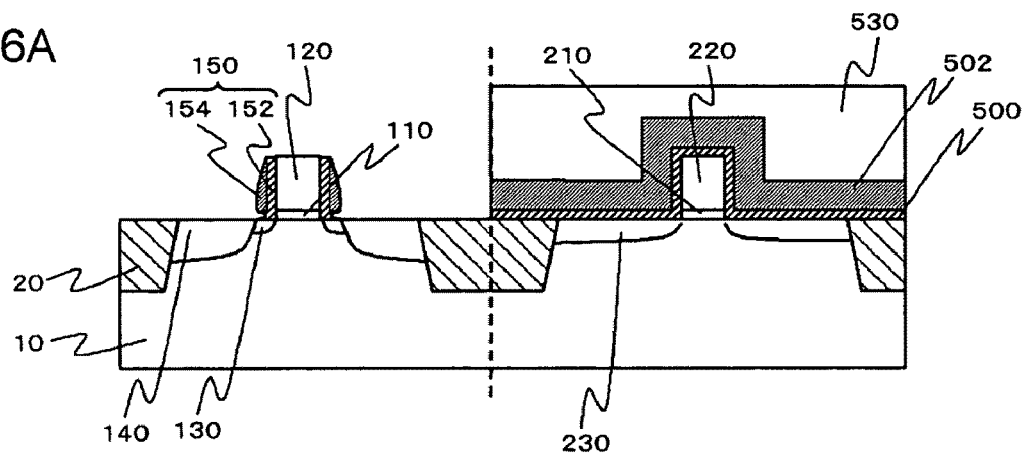
FIGS. 6A and 6B are cross-sectional views illustrating the method of manufacturing the semiconductor device according to a second embodiment.

Next, as shown in FIG. 6A, ion implantation is performed using the mask film 530, the device isolation insulating film 20, the first gate electrode 120, and the first sidewall 150 as a mask. Thereby, the source and drain region 140 used as a source and a drain of the first transistor 100 is formed.

Figure 6B:
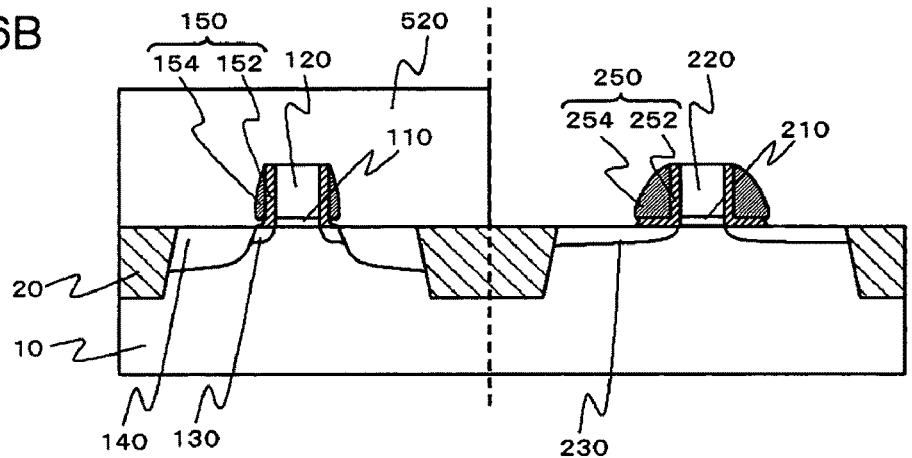

After that, as shown in FIG. 6B, the mask film 530 is removed. Next, the mask film 520 is formed on the substrate 10. The mask film 520 is, for example, a resist film, and covers the region (including the first gate electrode 120 and the first sidewall 150) in which the first transistor 100 is formed, but does not cover the region (including the second gate electrode 220) in which the second transistor 200 is formed.

Next, the first insulating film 500 and the second insulating film 502 are etched using the mask film 520 as a mask. Thereby, the second sidewall 250 is formed. At this time, the width of the second sidewall 250 is made larger than the width of the first sidewall 150 by adjusting etching conditions.

Figure 7:
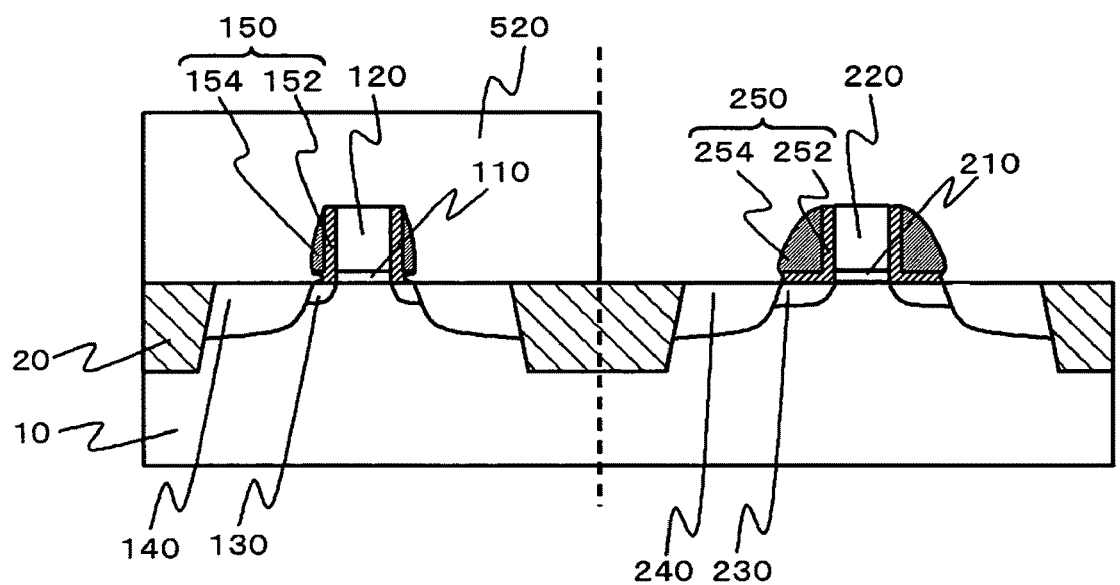
FIG. 7 is a cross-sectional view illustrating the method of manufacturing the semiconductor device according the second embodiment.

Next, as shown in FIG. 7, ion implantation is performed using the mask film 520, the device isolation insulating film 20, the second gate electrode 220, and the second sidewall 250 as a mask. Thereby, the source and drain region 240 used as a source and a drain of the second transistor 200 is formed.

After that, the mask film 520 is removed. Next, the etching stopper film 30, the insulating interlayer 40, the capacitive element 300, the contact plugs 42, 44, and 46, the insulating film among interconnects 41, and the interconnects 50 and 52 are formed as shown in FIG. 1.

It is also possible to obtain the same advantages as those of the first embodiment by the embodiment.

In addition, the logic circuit includes a densely-packed pattern and an isolated pattern, and the DRAM is formed only by a densely-packed pattern in many cases. In anisotropic etching for forming the sidewall, the etching rate in the isolated pattern of the logic circuit is slower than that of the densely-packed pattern. For this reason, it is often the case that the optimum time of etching in the logic circuit is longer than the optimum time of etching in the DRAM.

When the sidewall is formed by the same etching process in the logic circuit and the DRAM circuit, and the etching time is set to the optimum time of etching in the DRAM, the insulating film used as a sidewall in the logic circuit remains in a portion other than the sidewall. On the other hand, when the etching time is set to the optimum time of etching in the logic circuit, the etching amount of the substrate becomes larger in the DRAM and thus a defect occurs in the source and drain region. This defect causes the leak current from the capacitive element and thus the data retention characteristics of the DRAM are deteriorated.

On the other hand, since the first sidewall 150 and the second sidewall 250 are formed by a separate process in the embodiment, the etching conditions for forming each of them can be set to each of the optimum conditions. For this reason, it is possible to suppress the generation of the above-mentioned problems.

Third Embodiment

FIGS. 8A to 8D, FIGS. 9A to 9D, and FIG. 10 are cross-sectional views illustrating a method of manufacturing the semiconductor device according a third embodiment. The capacitive element 300 and the interconnects 50 and 52 are not shown in these drawings.

Figure 8A:
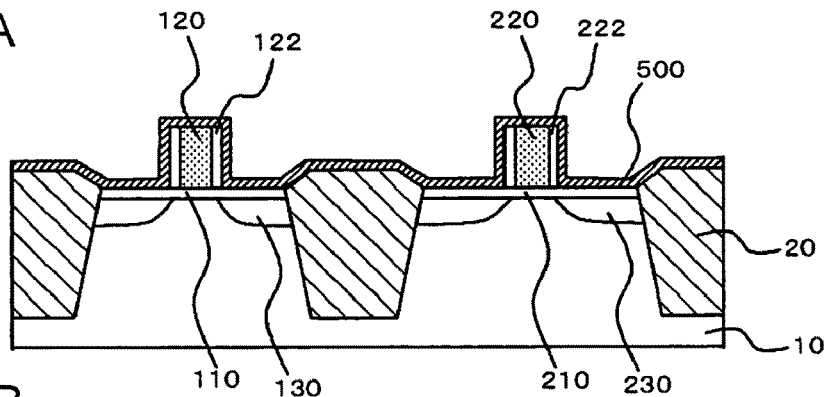
FIGS. 8A to 8D are cross-sectional views illustrating a method of manufacturing the semiconductor device according to a third embodiment.

First, as shown in FIG. 8A, the device isolation insulating film 20 is formed in the substrate 10, and the first gate insulating film 110 and the second gate insulating film 210, and the first gate electrode 120 and the second gate electrode 220 are further formed. A method of forming them is the same as that of the first embodiment. Next, an offset spacer film 122 is formed in the sidewall of the first gate electrode 120, and an offset spacer film 222 is formed in the sidewall in the second gate electrode 220. Next, impurities are implanted in the substrate 10 using the first gate electrode 120, the second gate electrode 220, the device isolation insulating film 20, and the offset spacer films 122 and 222 as a mask. Thereby, the extension regions 130 and 230 are formed. Meanwhile, the impurity implantation process for forming the extension region 130 is performed using a process separate from the impurity implantation process for forming the extension region 230. Next, the first insulating film 500 is formed. In the embodiment, the first insulating film 500 is, for example, a silicon nitride film.

Figure 8B:
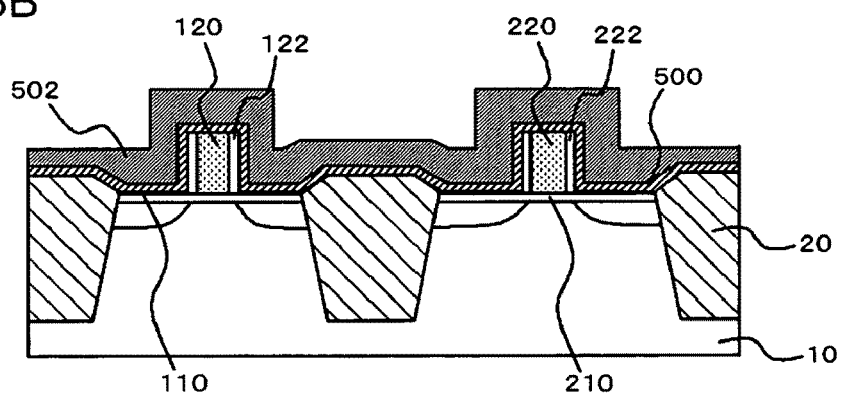

Next, as shown in FIG. 8B, the second insulating film 502 is formed on the first insulating film 500. In the embodiment, the second insulating film 502 is formed of materials different from the etching stopper film 30 as described later, and it is possible to raise etching selectivity with respect to the etching stopper film 30. The second insulating film 502 is, for example, a silicon oxide film, and is thicker than the first insulating film 500.

Figure 8C:
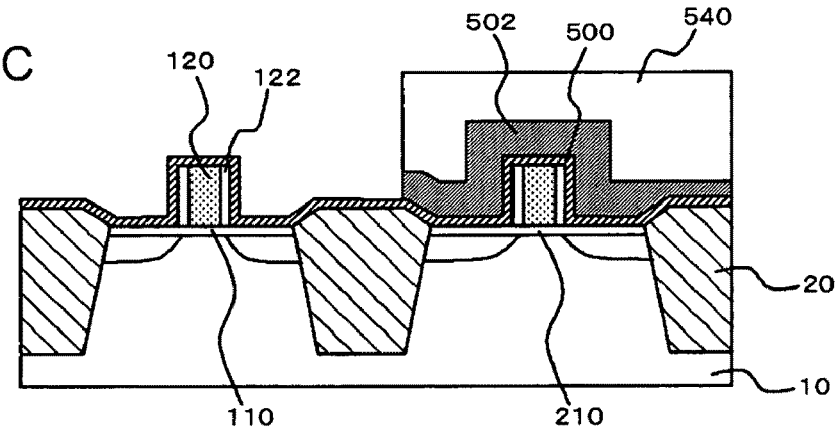

Next, as shown in FIG. 8C, a mask film 540 is formed on the second insulating film 502. The mask film 540 does not cover a portion located on the first gate electrode 120 in the second insulating film 502, but covers a portion located on the second gate electrode 220. Next, the second insulating film 502 is wet-etched using the mask film 540 as a mask. Thereby, a portion located on the first gate electrode 120 and on the periphery thereof in the second insulating film 502 is removed, and the second insulating film 502 is formed on the second gate electrode 220 and on the periphery thereof.

Figure 8D:
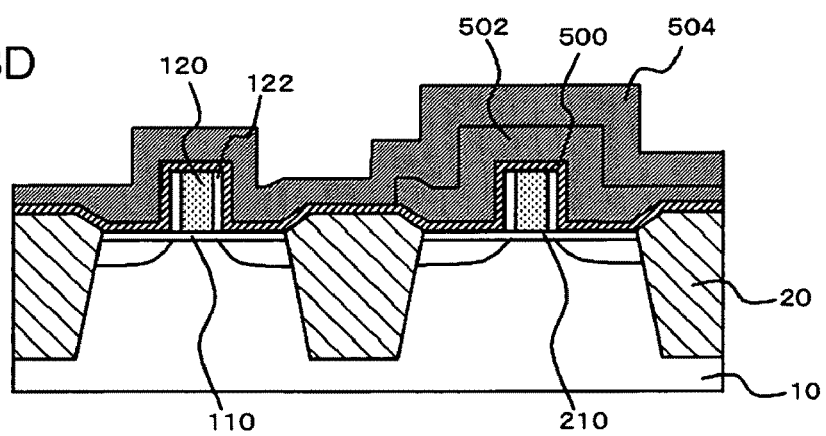

Next, as shown in FIG. 8D, a third insulating film 504 used as a sidewall is formed on the second insulating film 502, and the first gate electrode 120 and the periphery thereof. The third insulating film 504 is formed of the same materials as those of the second insulating film 502.

Figure 9A:
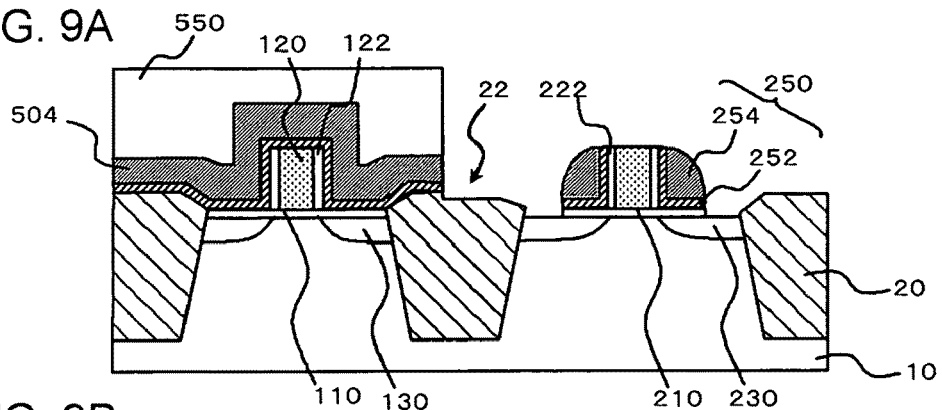
FIGS. 9A to 9D are cross-sectional views illustrating the method of manufacturing the semiconductor device according to a third embodiment.

Next, as shown in FIG. 9A, the third insulating film 504 located on the first gate electrode 120 and on the periphery thereof is covered with a mask film 550. The mask film 550 does not cover the third insulating film 504 located on the second gate electrode 220 and on the periphery thereof. In addition, the mask film 550 covers a portion near the region where the second transistor 200 is formed in the device isolation insulating film 20.

Next, the third insulating film 504 and the second insulating film 502 are etched using the mask film 550 as a mask, and the first insulating film 500 is further etched. In etching at this time, anisotropic dry etching is used. Thereby, the second sidewall 250 is formed. In this process, the surface of a portion which is not covered with the mask film 550 in the device isolation insulating film 20 is etched. Thereby, a step difference 22 is formed in the device isolation insulating film 20.

Figure 9B:
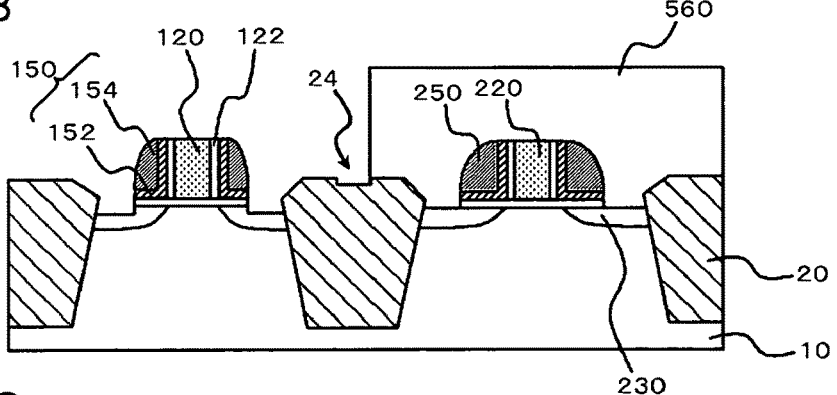

After that, as shown in FIG. 9B, the mask film 550 is removed. Next, the region where the extension region 230 is formed in the second gate electrode 220, the second sidewall 250, and the substrate 10 is covered with a mask film 560. The mask film 560 does not cover the third insulating film 504 located on the first gate electrode 120 and on the periphery thereof. In addition, the mask film 560 covers a portion near the region where the second transistor 200 is formed in the device isolation insulating film 20. At this time, the edge of the mask film 560 is kept away at a certain distance, for example, 20 nm or more from the step difference 22. This distance is set to be larger than the sum value of maximum values of the position shift amount of the mask films 550 and 560.

Next, the third insulating film 504 is etched using the mask film 560 as a mask, and the first insulating film 500 is further etched. In etching at this time, anisotropic dry etching is used. Thereby, the first sidewall 150 is formed. At this time, the width of the first sidewall 150 is made narrower than the width of the second sidewall 250.

Further, in this process, the surface of a portion which is not covered with the mask film 560 in the device isolation insulating film 20 is etched. As described above, the edge of the mask film 560 is kept away at a certain distance from the step difference 22. For this reason, a groove 24 is formed in the surface of the device isolation insulating film 20.

Figure 9C:
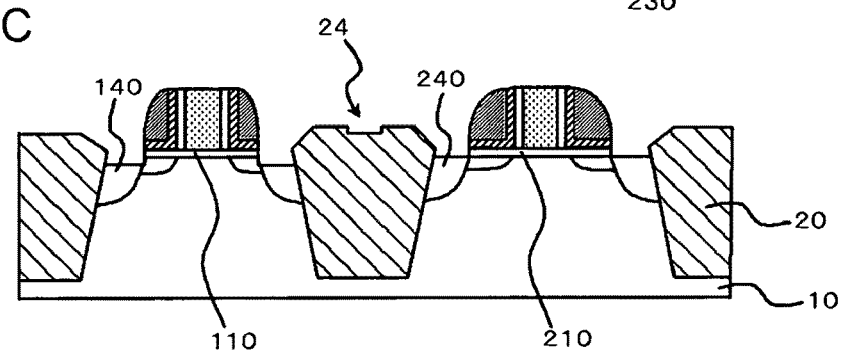

After that, as shown in FIG. 9C, the mask film 560 is removed. Next, the source and drain regions 140 and 240 are formed by performing ion implantation in the substrate 10. Meanwhile, the ion implantation process for forming the source and drain region 140 is performed using a process separate from the ion implantation process for forming the source and drain regions 240.

Figure 9D:
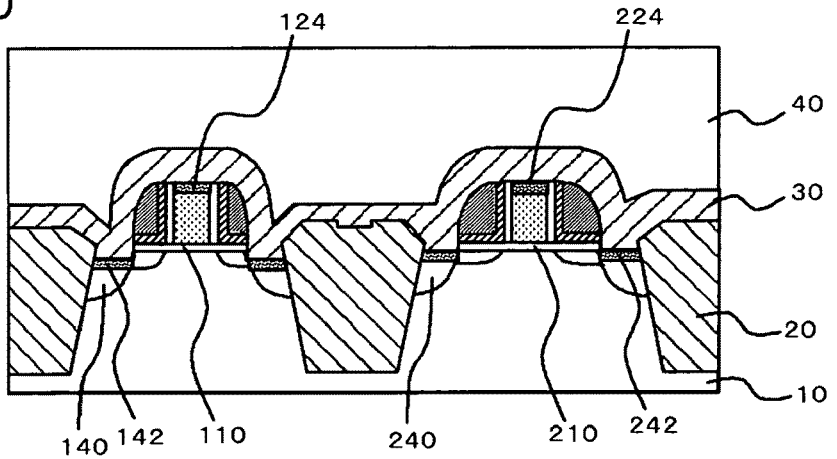

Next, as shown in FIG. 9D, a silicide forming metal film, for example, Ni or Co is formed in the whole surface including the upper portions of the source and drain regions 140 and 240, the first gate electrode 120, and the second gate electrode 220. Next, the metal film, the source and drain regions 140 and 240, the first gate electrode 120, and the second gate electrode 220 are heat-treated. Thereby, silicide films 142 and 242 are respectively formed on the source and drain regions 140 and 240, and silicide films 124 and 224 are respectively formed on the first gate electrode 120 and the second gate electrode 220. After that, the metal film which is not silicidized is removed. Next, the etching stopper film 30 and the insulating interlayer 40 are formed. The etching stopper film 30 is the same material that of the first embodiment, for example, a silicon nitride film.

Figure 10:
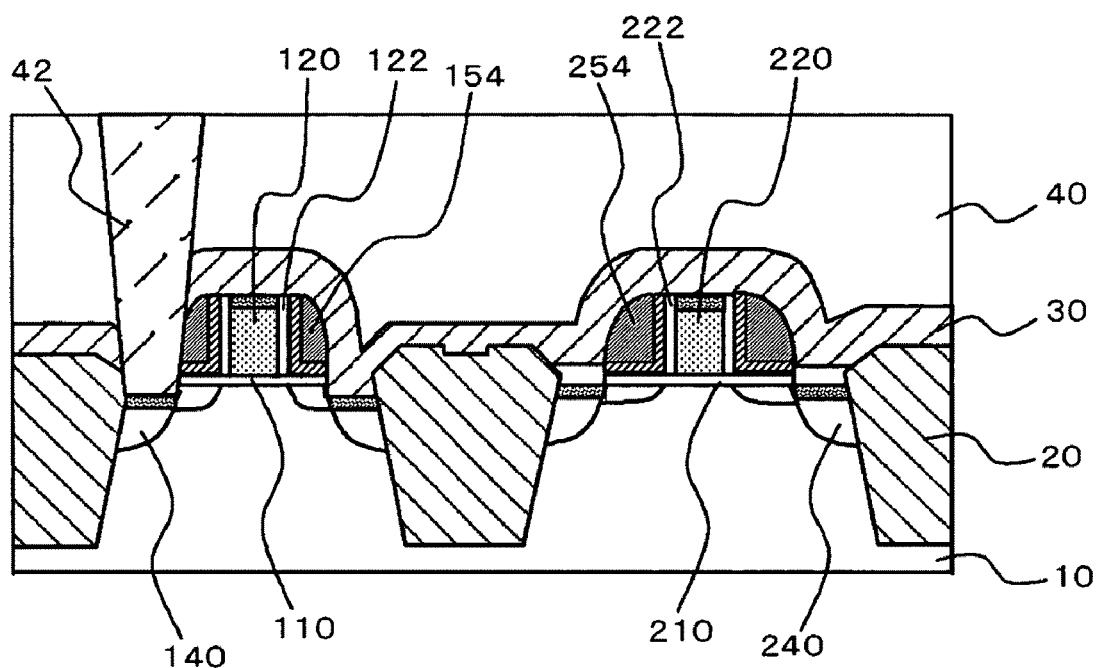
FIG. 10 is a cross-sectional view illustrating the method of manufacturing the semiconductor device according to a third embodiment.

Next, as shown in FIG. 10, a mask pattern (not shown) is formed on the insulating interlayer 40, and the insulating interlayer 40 and the etching stopper film 30 are etched using this mask pattern as a mask. Thereby, a contact hole connected to the source and drain region 140 is formed. Next, the contact plug 42 is formed by burying a conductor, for example, a metal such as Cu within this contact hole. Meanwhile, in this process, the contact plugs 44 and 46 shown in FIG. 1 are also formed, but are not shown in the same drawing. The capacitive element 300, the insulating film among interconnects 41, and the interconnects 50 and 52 shown in FIG. 1 are formed.

Figure 11:
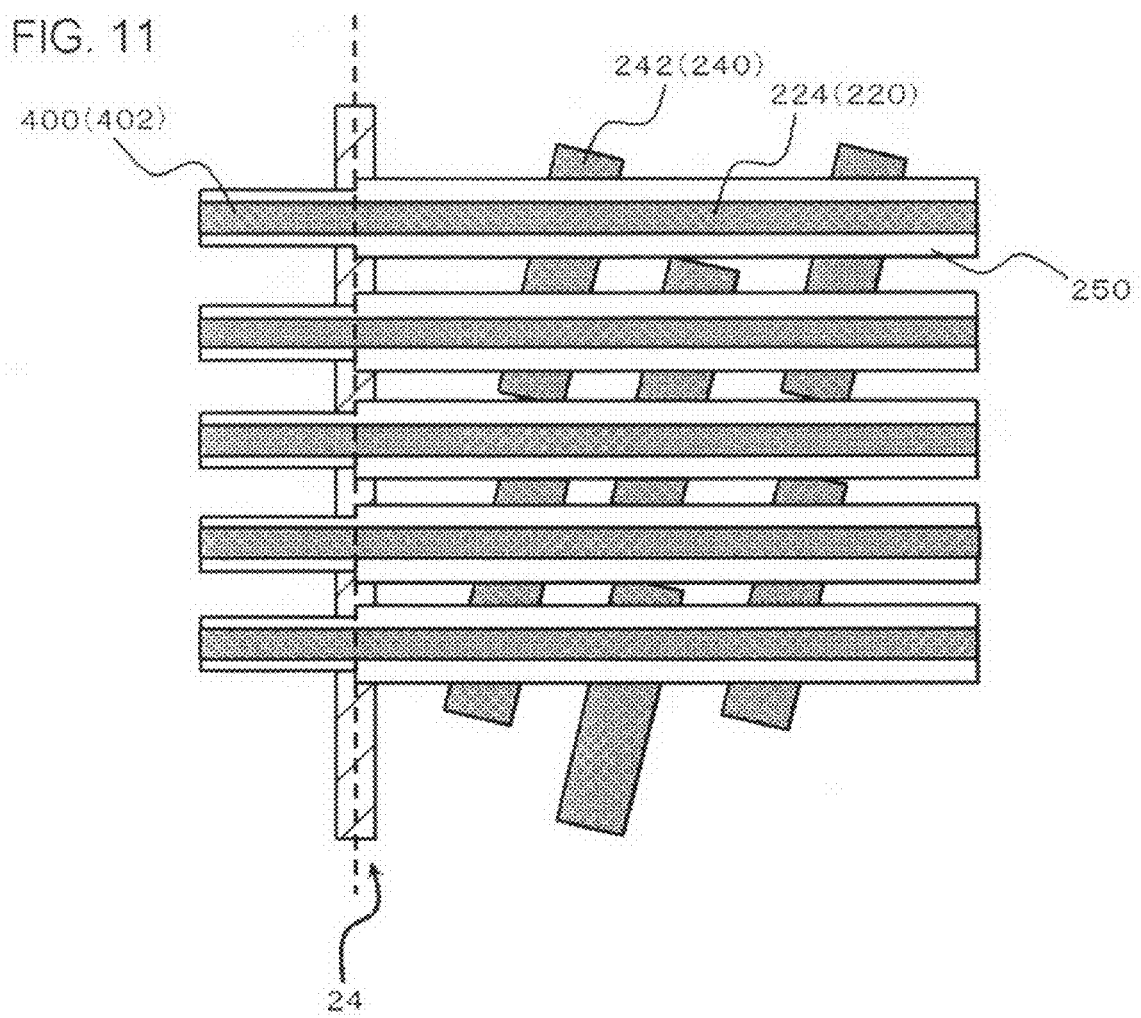
FIG. 11 is a plan view illustrating a state before an etching stopper film and an insulating interlayer are formed in the semiconductor device shown in FIG. 9D.

FIG. 11 is a plan view illustrating a state before the etching stopper film 30 and the insulating interlayer 40 are formed in the semiconductor device shown in FIG. 9D. In the process of forming the first gate electrode 120 and the second gate electrode 220, a gate interconnect 400 is formed on the device isolation insulating film 20. The gate interconnect 400 is formed of an extraction interconnect of the second gate electrode 220, and is connected to the second gate electrode 220. In the process of forming the silicide films 124, 142, 224, and 242, a silicide film 402 is also formed in the surface layer of the gate interconnect 400. Meanwhile, the gate interconnect 400 lies across the groove 24.

According to the embodiment, it is also possible to obtain the same advantages as those of the first embodiment. In addition, the second insulating film 154 in which the surface layer of the first sidewall 150 is formed is formed by materials different from those of the etching stopper film 30, and this can raise etching selectivity with respect to the etching stopper film 30.

Figure 12:
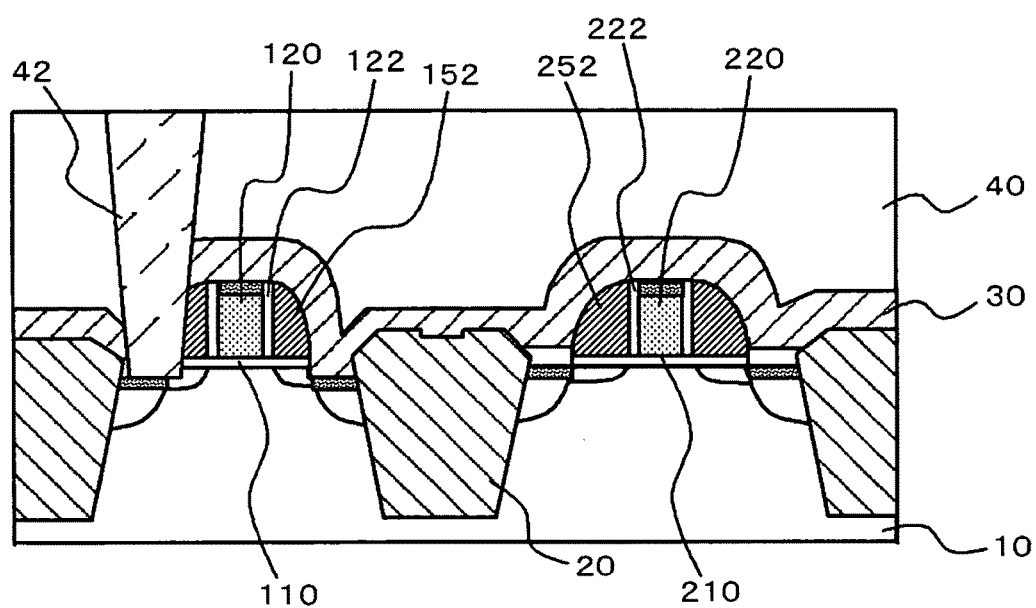
FIG. 12 is a cross-sectional view illustrating the configuration of the semiconductor device according to a comparative example.

When the whole first sidewall 150 cannot raise etching selectivity with respect to the etching stopper film 30, it is considered that the first sidewall 150 is formed only by the first insulating film 152, for example, as shown in FIG. 12. In this case, when the position of the contact hole for burying the contact plug 42 is shifted to thereby overlap with first sidewall 150, the contact hole passes through the first sidewall 150 and thus the contact plug 42 is connected to the extension region 130. The extension region 130 is shallow in depth relative to the source and drain region 140. Therefore, in this case, the leak current of the first transistor 100 is increased.

On the other hand, in the embodiment, the second insulating film 154 in which the surface layer of the first sidewall 150 is formed has a high etching selectivity with respect to the etching stopper film 30 as described above. Therefore, even when the position of the contact hole for burying the contact plug 42 is shifted to thereby overlap with the first sidewall 150, the contact hole does not pass through the first sidewall 150 and thus the leak current of the first transistor 100 is not increased.

In addition, as shown in FIG. 13, it is considered that at least one of the mask film 550 and the mask film 560 is shifted, and a portion of the third insulating film 504 is covered by both the mask film 550 and the mask film 560. In this case, the third insulating film 504 remains in a portion which is covered by both the mask film 550 and the mask film 560 in the device isolation insulating film 20, and thus a portion of the gate interconnect 400 is caused to be covered by the third insulating film 504. In this case, the silicide film 402 is not formed in a portion which is covered by the third insulating film 504 in the gate interconnect 400. As a result, resistance of the gate interconnect 400 is increased.

On the other hand, in the embodiment, the edge of the mask film 560 is kept away at a certain distance, for example, 20 nm or more from the step difference 22. For this reason, as shown in the plan view of FIG. 11, even when at least one of the mask film 550 and the mask film 560 is shifted, the third insulating film 504 is not covered by both the mask film 550 and the mask film 560 in any of the portions. Therefore, a portion in which the silicide film 402 is not formed is suppressed from remaining in the gate interconnect 400.

In addition, since the first sidewall 150 and the second sidewall 250 are formed by a separate process, it is possible to set etching conditions for forming each of them to each of the optimum conditions. For this reason, the insulating film for forming the sidewall is suppressed from remaining on the first gate electrode 120, the second gate electrode 220, or the gate interconnect 400. Therefore, it is possible to form the silicide films 124, 224, and 402 on the entirety of the surfaces of the first gate electrode 120, the second gate electrode 220, and the gate interconnect 400.

Fourth Embodiment

FIGS. 14A to 14C and FIGS. 15A to 15C are cross-sectional views illustrating a method of manufacturing the semiconductor device according to a fourth embodiment. Hereinafter, the same reference numerals are assigned to the same components as those in the third embodiment, descriptions thereof will not be repeated.

Figure 14A:
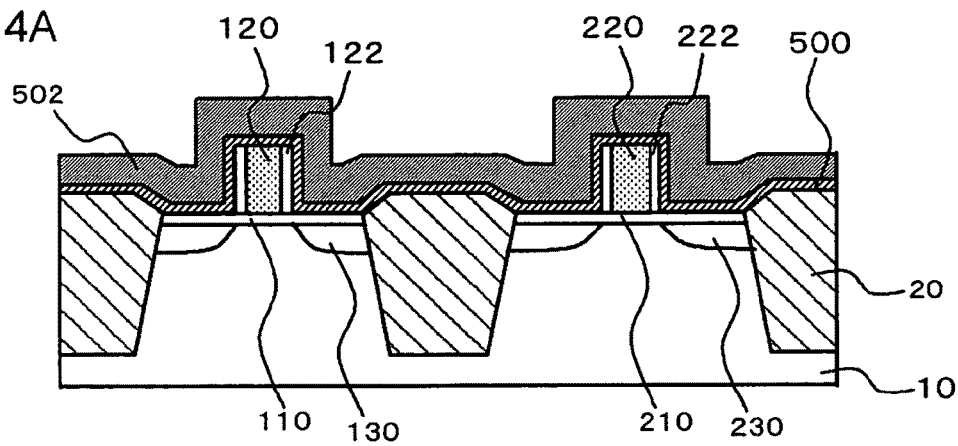
FIGS. 14A to 14C are cross-sectional views illustrating a method of manufacturing the semiconductor device according to a fourth embodiment.

First, as shown in FIG. 14A, the device isolation insulating film 20 is formed in the substrate 10, and further formed are the first gate insulating film 110 and the second gate insulating film 210, the first gate electrode 120 and the second gate electrode 220, the offset spacer films 122 and 222, the extension regions 130 and 230, the first insulating film 500, and the second insulating film 502. A method of forming them is the same as that of the third embodiment.

Figure 14B:
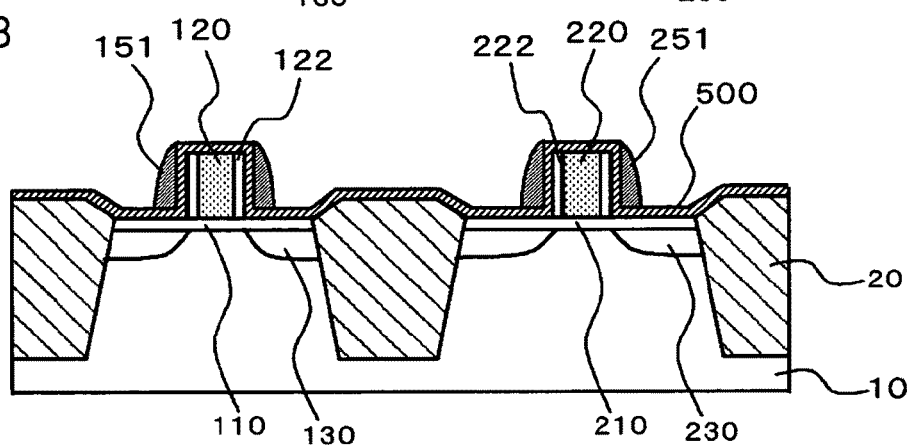

Next, as shown in FIG. 14B, the second insulating film 502 is etched. In etching at this time, anisotropic dry etching is used. Thereby, a sidewall 251 used as a portion of the second sidewall 250 is formed on the sidewall of the second gate electrode 220. In addition, the second insulating film 502 remains on the sidewall of the first gate electrode 120, and is used as a sidewall 151.

Figure 14C:
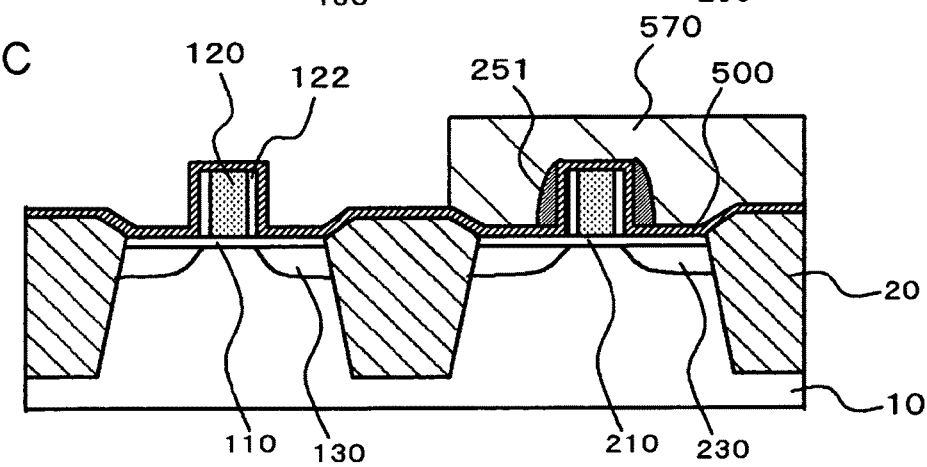

Next, as shown in FIG. 14C, the sidewall 251 and the second gate electrode 220 are covered by a mask film 570. The mask film 570 does not cover the first gate electrode 120 and the sidewall 151. Next, wet etching is performed using the mask film 570 as a mask, and the sidewall 151 is removed.

Figure 15A:
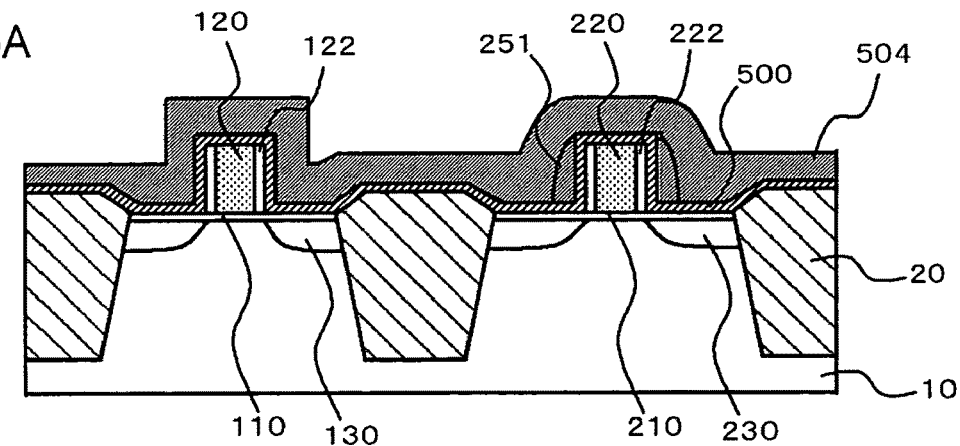
FIGS. 15A to 15C are cross-sectional views illustrating the method of manufacturing the semiconductor device according to the fourth embodiment.

After that, as shown in FIG. 15A, the mask film 570 is removed. Next, the third insulating film 504 used as a sidewall is formed on the entirety of the surfaces including the upper portions of the first gate electrode 120 and the lateral face thereof, the second gate electrode 220, and the sidewall 251.

Figure 15B:
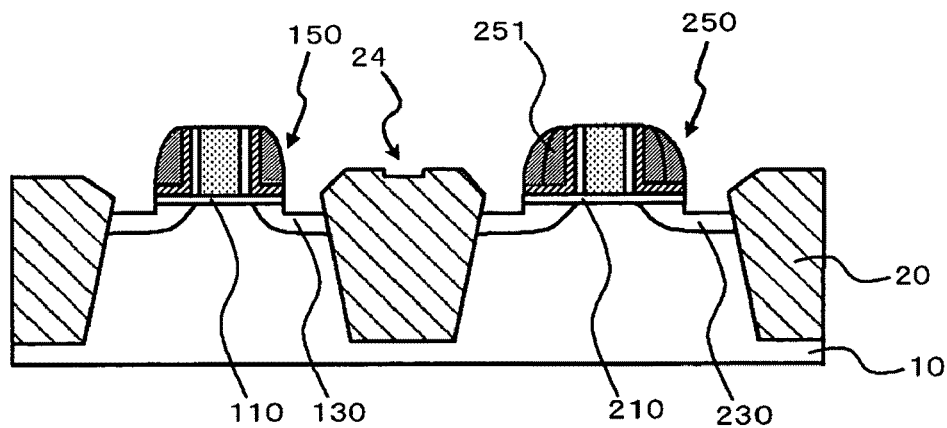

Next, as shown in FIG. 15B, the third insulating film 504 is etched. In etching at this time, anisotropic dry etching is used. Thereby, the first sidewall 150 and the second sidewall 250 are formed.

Figure 15C:
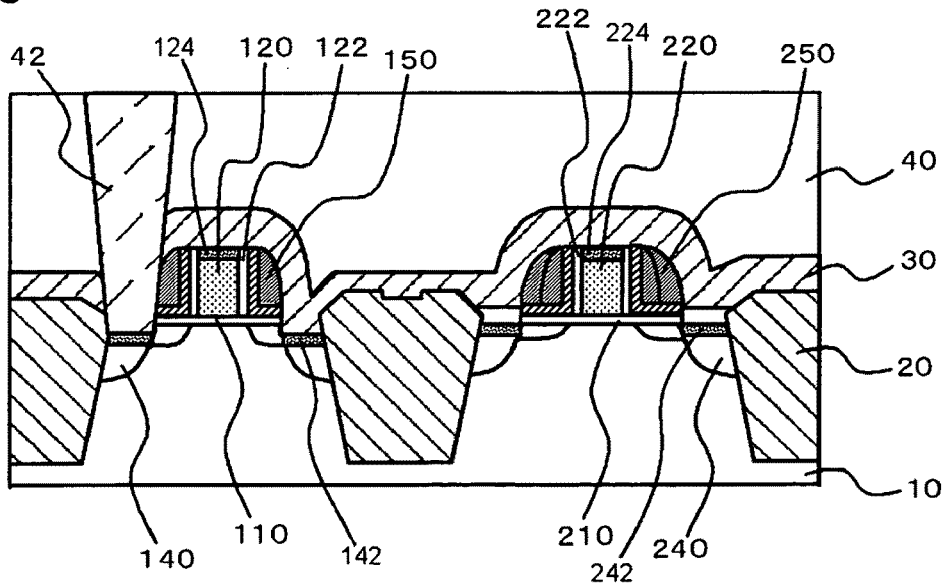

After that, as shown in FIG. 15C, formed are the source and drain regions 140 and 240, the silicide films 142, 242, 124, and 224, the etching stopper film 30, the insulating interlayer 40 and the contact plug 42. And as shown in FIG. 1, formed are the capacitive element 300, the insulating film among interconnects 41, and the interconnects 50 and 52. A method of forming them is the same as that of the third embodiment.

According to the embodiment, it is also possible to obtain the same advantages as those of the first embodiment.

As described above, although the embodiments of the invention have been set forth with reference to the drawings, they are merely illustrative of the invention, and various configurations other than the foregoing can be adopted.

It is apparent that the present invention is not limited to the above embodiments, but may be modified and changed without departing from the scope and spirit of the invention.

What is claimed is:

1. A method of manufacturing a semiconductor device, said method comprising:
    forming, on a substrate, a first gate insulating film and a first gate electrode of a first transistor which is included in a logic circuit, and a second gate insulating film and a second gate electrode of a second transistor which is included in a memory cell of a DRAM (Dynamic Random Access Memory) or a portion of a peripheral circuit that performs writing and erasing with respect to the DRAM;
    forming an extension region of said first transistor and an extension region of said second transistor;
    forming a first sidewall in a sidewall of said first gate electrode;
    forming a second sidewall having a larger width than that of said first sidewall in a sidewall of said second gate electrode; and
    forming a source and drain region in each of said first transistor and said second transistor,
    wherein a layer structure of said first sidewall is the same as a layer structure of said second sidewall.

2. A method of manufacturing a semiconductor device, said method comprising:
    forming, on a substrate, a first gate insulating film and a first gate electrode of a first transistor which is included in a logic circuit, and a second gate insulating film and a second gate electrode of a second transistor which is included in a memory cell of a DRAM (Dynamic Random Access Memory) or a portion of a peripheral circuit that performs writing and erasing with respect to the DRAM;
    forming an extension region of said first transistor and an extension region of said second transistor;
    forming a first sidewall in a sidewall of said first gate electrode;
    forming a second sidewall having a larger width than that of said first sidewall in a sidewall of said second gate electrode; and
    forming a source and drain region in each of said first transistor and said second transistor,
    wherein said forming said first sidewall and said second sidewall includes:
        forming an insulating film used as a sidewall over the substrate, said first gate electrode, and said second gate electrode;
        forming said first sidewall and said second sidewall by etching said insulating forming a mask film that covers said second gate electrode and said second sidewall, and that does not cover said first gate electrode and said first sidewall;
        narrowing the width of said first sidewall by performing etching using said mask film as a mask; and
        removing said mask film.

3. The method of manufacturing the semiconductor device as set forth in claim 2, further comprising:
    forming said source and drain region of said first transistor by performing an ion implantation using said mask film, said first gate electrode, and said first sidewall as a mask, after said forming the mask film, and before said removing the mask film.

4. The method of manufacturing of the semiconductor device as set forth in claim 2, wherein said narrowing the width of the first sidewall includes wet-etching said first sidewall, and, after said removing the mask film, the method further comprises:
    forming an etching stopper film over said first transistor and said second transistor; and
    forming an insulating interlayer over said etching stopper film.

5. A method of manufacturing a semiconductor device, said method comprising:
    forming, on a substrate a to insulating film and a first gate electrode of a first transistor which is included in circuit, and a second gate insulating film and a second gate electrode of a second transistor which is included in a memory cell of a DRAM (Dynamic Random Access Memory) or a portion of a peripheral circuit that performs writing and erasing with respect to the DRAM;

forming an extension region of said first transistor and an extension region of said second transistor;

forming a first sidewall in a sidewall of said first gate electrode;

forming a second sidewall having a larger width than that of said first sidewall in a sidewall of said second gate electrode; and forming a source and drain region in each of said first transistor and said second transistor, wherein said forming the first sidewall and the second sidewall includes:

forming an insulating film used as a sidewall over said substrate, said first gate electrode, and said second gate electrode;

covering one of said insulating film located over said first gate electrode and said insulating film located over said second gate electrode by a first mask film, while not covering another one of said insulating film, by said first mask film;

forming one of said first sidewall and said second sidewall by etching said insulating film using said first mask film as a mask;

removing said first mask film;

covering said one of said first sidewall and said second sidewall by a second mask film, while not covering said another one of said insulating film located over said first gate electrode and said insulating film located over said second gate electrode by said second mask film; and forming another of said first sidewall and said second sidewall by etching said insulating film using said second mask film as a mask.

6. A method of manufacturing a semiconductor device, said method comprising:

forming, on a substrate, a first gate insulating film and a first gate electrode of a first transistor which is included in a logic circuit, and a second gate insulating film and a second gate electrode of, a second transistor which is included in a memory cell of a DRAM (Dynamic Random Access Memory) or a portion of a peripheral circuit that performs writing and erasing with respect to the DRAM;

forming an extension region of said first transistor and an extension region of said second transistor;

forming a first sidewall in a sidewall of said first gate electrode;

forming a second sidewall having a larger width than that of said first sidewall in a sidewall of said second gate electrode; and forming a source and drain region in each of said first transistor and said second transistor, wherein said forming the first sidewall and the second sidewall includes:

forming an insulating film used as a sidewall over said substrate, said first gate electrode, and said second gate electrode;

forming a portion of said second sidewall by etching said insulating film, while said insulating film remains in a sidewall of said first gate electrode;

covering said portion of said second sidewall and said second gate electrode by a mask film, while not covering said insulating film remaining in the sidewall of said first gate electrode by said mask film;

removing said insulating film remaining in the sidewall of said first gate electrode by etching using said mask film as a mask;

forming another insulating film used as a sidewall over said first gate electrode, said second gate electrode, and said portion of said second sidewall; and forming another portion of said second sidewall by etching said another insulating film, and forming said first sidewall.

7. A method of manufacturing a semiconductor device, said method comprising:

forming, on a substrate a first a insulating film and a first gate electrode of a first transistor which is included in a logic circuit, and a second gate insulating and a second gate electrode of a second transistor which is included in a memory cell of a DRAM (Dynamic Random Access Memory) or a portion of a peripheral circuit that performs writing and erasing with respect to the DRAM;

forming an extension region of said first transistor and an extension region of said second transistor;

forming a first sidewall a sidewall of said first gate electrode;

forming a second sidewall having a larger width than that of said first sidewall in a sidewall of said second gate electrode;

forming a source and drain region in each of said first transistor and said second transistor; and after said forming the source and drain region in each of the first transistor and the second transistor:

forming an etching stopper film over said first transistor and said second transistor;

forming an insulating interlayer over said etching stopper film; and forming a contact connected to said source and drain region in said insulating interlayer and said etching stopper film, wherein at least a surface layer of said first sidewall is formed by a material different from said etching stopper film.

8. A method of manufacturing a semiconductor device, said method comprising:

forming, on a substrate, a first gate insulating film and a first gate electrode of a first transistor which is included in a logic circuit, and a second gate insulating film and a second gate electrode of a second transistor which is included in a memory cell of a DRAM (Dynamic Random Access Memory) or a portion of a peripheral circuit that performs writing and erasing with respect to the DRAM;

forming an extension region of said first transistor and an extension region of said second transistor;

forming a first sidewall in a sidewall of said first gate electrode;

forming second sidewall having a larger width than that of said first sidewall in a sidewall of said second gate electrode; and forming a source and drain region in each of said first transistor and said second transistor, wherein said forming said first sidewall and said second sidewall includes:

forming an insulating film used as a sidewall over said second gate electrode and in a periphery thereof;

forming another insulating film used as a sidewall over said second insulating film and said first gate electrode and in a periphery thereof; and forming said first sidewall by etching said another insulating film located over said first gate electrode and in a periphery thereof, and forming said second sidewall by etching said second insulating film and said another insulating film located over the second insulating film.

9. A method of manufacturing a semiconductor device, said method comprising:
  forming, on a substrate, a first gate insulating film and a first gate electrode of a first transistor which is included in a logic circuit, and a second gate insulating film and a second gate electrode of a second transistor which is included in a memory cell;
  forming an extension region of said first transistor and an extension region of said second transistor;
  forming a first sidewall in a sidewall of said first gate electrode;
  forming a second sidewall having a larger width than that of said first sidewall in a sidewall of said second gate electrode; and
  forming a source and drain region in each of said first transistor and said second transistor,
  wherein said forming said first sidewall and said second sidewall includes:
    forming an insulating film used as a sidewall over the substrate, said first gate electrode, and said second gate electrode;
    forming said first sidewall and said second sidewall by etching said insulating film;
    forming a mask film that covers said second gate electrode and said second sidewall, and that does not cover said first gate electrode and said first sidewall;
    narrowing the width of said first sidewall by performing etching using said mask film as a mask; and
    removing said mask film.

10. A method of manufacturing a semiconductor device, said method comprising:
  forming, on a substrate, a first gate insulating film and a first gate electrode of a first transistor which is included in a logic circuit, and a second gate insulating film and a second gate electrode of a second transistor which is included in a memory cell;
  forming an extension region of said first transistor and an extension region of said second transistor;
  forming a first sidewall in a sidewall of said first gate electrode;
  forming a second sidewall having a larger width than that of said first sidewall in a sidewall of said second gate electrode;
  forming a source and drain region in each of said first transistor and said second transistor,
  wherein said forming said first sidewall and said second sidewall includes:
    forming an insulating film used as a sidewall over the substrate, said first gate electrode, and said second gate electrode;
    forming said first sidewall and said second sidewall by etching said insulating film;
    forming a mask film that covers said second gate electrode and said second sidewall, and that does not cover said first gate electrode and said first sidewall;
    narrowing the width of said first sidewall by performing etching using said mask film as a mask; and
    removing said mask film; and
  forming said source and drain region of said first transistor by performing an ion implantation using said mask film, said first gate electrode, and said first sidewall as a mask, after said forming the mask film, and before said removing the mask film.

11. A method of manufacturing a semiconductor device, said method comprising:
  forming, on a substrate, a first gate insulating film and a first gate electrode of a first transistor which is included in a logic circuit, and a second gate insulating film and a second gate electrode of a second transistor which is included in a memory cell;
  forming an extension region of said first transistor and an extension region of said second transistor;
  forming a first sidewall in a sidewall of said first gate electrode;
  forming a second sidewall having a larger width than that of said first sidewall in a sidewall of said second gate electrode; and
  forming a source and drain region in each of said first transistor and said second transistor,
  wherein said forming said first sidewall and said second sidewall includes:
    forming an insulating film used as a sidewall over the substrate, said first gate electrode, and said second gate electrode;
    forming said first sidewall and said second sidewall by etching said insulating film;
    forming a mask film that covers said second gate electrode and said second sidewall, and that does not cover said first gate electrode and said first sidewall;
    narrowing the width of said first sidewall by performing etching using said mask film as a mask; and
    removing said mask film, and
  wherein said narrowing the width of the first sidewall includes wet-etching said first sidewall, and, after said removing the mask film, the method further comprising:
    forming an etching stopper film over said first transistor and said second transistor; and
    forming an insulating interlayer over said etching stopper film.

12. A method of manufacturing a semiconductor device, said method comprising:
  forming, on a substrate, a first gate insulating film and a first gate electrode of a first transistor, and a second gate insulating film and a second gate electrode of a second transistor which is included in a memory cell;
  forming an extension region of said first transistor and an extension region of said second transistor;
  forming a first sidewall in a sidewall of said first gate electrode;
  forming a second sidewall having a larger width than that of aid first sidewall in a sidewall of said second gate electrode; and
  forming a source and drain region in each of said first transistor and said second transistor,
  wherein said forming said first sidewall and said second sidewall includes:
    forming an insulating film used as a sidewall over the substrate, said first gate electrode, and said second gate electrode;
    forming said first sidewall and said second sidewall by etching said insulating forming a mask film that covers said second gate electrode and said second sidewall, and that does not cover said first gate electrode and said first sidewall;
    narrowing the width of said first sidewall by performing etching using said mask film as a mask; and
    removing said mask film.

13. A method of manufacturing a semiconductor device, said method comprising:

forming, on a substrate, a first gate insulating film and a first gate electrode of a first transistor, and a second gate insulating film and a second gate electrode of a second transistor which is included in a memory cell;

forming an extension region of said first transistor and an extension region of said second transistor;

forming a first sidewall in a sidewall of said first gate electrode;

forming a second sidewall having a larger width than that of said first sidewall in a sidewall of said second gate electrode;

forming a source and drain region in each of said first transistor and said second transistor, wherein said forming said first sidewall and said second sidewall includes:

forming an insulating film used as a sidewall over the substrate, said first gate electrode, and said second gate electrode;

forming said first sidewall and said second sidewall by etching said insulating film;

forming a mask film that covers said second gate electrode and said second sidewall, and that does not cover said first gate electrode and said first sidewall;

narrowing the width of said first sidewall by performing etching using said mask film as a mask; and removing said mask film; and forming said source and drain region of said first transistor by performing an ion implantation using said mask film, said first gate electrode, and said first sidewall as a mask, after said forming the mask film, and before said removing the mask film.

14. A method of manufacturing a semiconductor device, said method comprising:

forming, on a substrate, a first gate insulating film and a first gate electrode of a first transistor, and a second gate insulating film and a second gate electrode of a second transistor which is included in a memory cell;

forming an extension region of said first transistor and an extension region of said second transistor;

forming a first sidewall in a sidewall of said first gate electrode;

forming a second sidewall having a larger width than that of said first sidewall in a sidewall of said second gate electrode; and forming a source and drain region in each of said first transistor and said second transistor, wherein said forming said first sidewall and said second sidewall includes:

forming an insulating film used as a sidewall over the substrate, said first gate electrode, and said second gate electrode;

forming said first sidewall and said second sidewall by etching said insulating film;

forming a mask film that covers said second gate electrode and said second sidewall, and that does not cover said first gate electrode and said first sidewall;

narrowing the width of said first sidewall by performing etching using said mask film as a mask; and removing said mask film, and wherein said narrowing the width of the first sidewall includes wet-etching said first sidewall, and, after said removing the mask film, the method further comprising:

forming an etching stopper film over said first transistor and said second transistor; and forming an insulating interlayer over said etching stopper film.

\* \* \* \* \*